US012135249B2

(12) United States Patent
Stary et al.

(10) Patent No.: US 12,135,249 B2
(45) Date of Patent: Nov. 5, 2024

(54) SENSOR INTERFACE WITH TEMPERATURE SIGNAL PROCESSING

(71) Applicant: Allegro MicroSystems, LLC, Manchester, NH (US)

(72) Inventors: Richard Stary, Dolni Brezany (CZ); Petr Hribal, Usti nad Labem (CZ); Milan Valenta, Hostivice (CZ); Miloslav Trnka, Praha Krc (CZ)

(73) Assignee: Allegro MicroSystems, LLC, Manchester, NH (US)

( * ) Notice: Subject to any disclaimer, the term of this patent is extended or adjusted under 35 U.S.C. 154(b) by 583 days.

(21) Appl. No.: 17/199,790

(22) Filed: Mar. 12, 2021

(65) Prior Publication Data

US 2022/0291055 A1    Sep. 15, 2022

(51) Int. Cl.
*G01K 7/25* (2006.01)
*H03F 3/45* (2006.01)
*H03M 1/12* (2006.01)

(52) U.S. Cl.
CPC ............ *G01K 7/25* (2013.01); *H03F 3/45071* (2013.01); *H03M 1/12* (2013.01)

(58) Field of Classification Search
CPC .. G01K 7/00; G01K 7/01; G01K 7/02; G01K 7/021; G01K 7/14; G01K 7/21; G01K 7/25; G01K 7/16; G01K 7/22; G01K 15/005; G01K 7/015; H03F 3/45071; H03F 2200/447; H03F 2203/45138; H03F 1/3211; H03F 3/45968; H03F 3/45475; H03M 1/12; G01L 1/2281; G01R 19/32
USPC ....................................................... 374/171
See application file for complete search history.

(56) References Cited

U.S. PATENT DOCUMENTS

| | | | |
|---|---|---|---|
| 9,389,060 B2 | 7/2016 | Romero et al. | |
| 10,024,891 B2* | 7/2018 | Draxelmayr | ......... G01R 15/146 |
| 10,209,732 B2 | 2/2019 | Cook | |
| 10,684,611 B2* | 6/2020 | O'Connell | ......... G05B 19/0423 |
| 11,454,655 B2* | 9/2022 | Kasuya | .................. G01R 19/32 |

(Continued)

FOREIGN PATENT DOCUMENTS

WO    WO-2018155217 A1 *    8/2018

OTHER PUBLICATIONS

Sarkar et al., "Linearization of NTC Thermistor Characteristic Using Op-Amp Based Inverting Amplifier," in IEEE Sensors Journal, vol. 13, No. 12, pp. 4621-4626, Dec. 2013 (Year: 2013).*

(Continued)

*Primary Examiner* — Daniel R Miller
*Assistant Examiner* — Matthew W. Baca
(74) *Attorney, Agent, or Firm* — Daly, Crowley, Mofford & Durkee, LLP

(57) ABSTRACT

A sensor interface includes a signal path configured to receive a sensing element output signal from a sensing element and to generate an interface output signal indicative of a parameter sensed by the sensing element, an NTC interface and a diode interface. The NTC interface is configured to be coupled to an NTC element having a non-linear resistance over temperature and to generate an NTC signal indicative of a linearized version of the non-linear resistance of the NTC element and the diode interface configured to be coupled to a diode and to generate a diode signal indicative of an absolute temperature.

18 Claims, 6 Drawing Sheets

(56) References Cited

U.S. PATENT DOCUMENTS

| | | | | |
|---|---|---|---|---|
| 2002/0083776 | A1* | 7/2002 | Tanizawa | G01L 9/065 |
| | | | | 73/753 |
| 2009/0122834 | A1* | 5/2009 | Wang | G01K 7/21 |
| | | | | 374/185 |
| 2010/0020842 | A1* | 1/2010 | Riddle | G01K 7/24 |
| | | | | 374/E19.001 |
| 2013/0266041 | A1* | 10/2013 | Giri | G01K 7/22 |
| | | | | 374/171 |
| 2014/0209787 | A1* | 7/2014 | Gudaitis | H03F 3/087 |
| | | | | 250/208.2 |
| 2020/0355560 | A1* | 11/2020 | Shimizu | G01K 1/20 |
| 2021/0310875 | A1* | 10/2021 | Sato | G11C 11/40626 |
| 2021/0399703 | A1* | 12/2021 | Kyakuno | H03G 1/0088 |

OTHER PUBLICATIONS

Melexis Datasheet "MLX90329, Automotive Sensor Interfaces", Revision 002, Dec. 22, 2017, 31 pages.
TDK Application Note "How to Use Temperature Protection Devices: Chip NTC Thermistors", 2018, 8 pages.
Texas Instruments Application Report "Optimizing Remote Temperature Sensor Design", Jan. 2017, 18 pages.
Vishay Bccomponents Application Note "NTC Thermistors", Revision: 27, Jan. 2021, 11 pages.
Yan Thesis "Voltage Calibration of BJT Based Temperature Sensor", undated, 37 pages.

\* cited by examiner

SENSOR INTERFACE WITH TEMPERATURE SIGNAL PROCESSING

CROSS REFERENCE TO RELATED APPLICATIONS

Not Applicable.

STATEMENT REGARDING FEDERALLY SPONSORED RESEARCH

Not Applicable.

FIELD

The present disclosure relates generally to sensor interface circuits and more specifically to such circuits that process a Negative Temperature Coefficient (NTC) signal and/or a diode signal.

BACKGROUND

As is known, sensors are used to perform various functions in a variety of applications. Sensors generally include one or more sensing elements and electronic circuitry for processing signals from the sensing elements to generate one or more output signals indicative of the sensed parameter.

Some sensors can be provided in the form of integrated circuits (IC) that incorporate the sensing elements within the IC package (e.g., supported by a semiconductor die), in which case the sensor can be referred to as a sensor IC. Other sensors can include one or more ICs that interface with external sensing elements, in which case the IC can be referred to as an interface IC.

Some sensors include one or more sensing elements to sense a pressure, such as strain gauge including one or more piezoresistive elements. Another sensor type includes one or more magnetic field sensing elements, such as Hall effect elements or magnetoresistive elements, to sense a magnetic field associated with proximity or motion (e.g., speed or direction of motion) of a target object, such as a ferromagnetic object in the form of a gear as may be used with a so-called back bias magnet or a permanent magnet in the form of a ring magnet, as examples. Other sensors can sense angular position of the target relative to the sensor and/or a current level through a conductor target, as examples. In general, magnetic field sensor applications include, but are not limited to, a magnetic switch that senses the proximity of a ferromagnetic object, a rotation detector (or movement detector) that senses passing features of a target, an angle sensor that senses an angle of a direction of a magnetic field, a current sensor that senses a magnetic field generated by a current carried by a conductor, and a linear magnetic field sensor that senses a magnetic field density of a magnetic field. Still other sensor types include optical sensors.

Sensors are widely used in automobile control systems and other safety critical applications. There are a variety of specifications that set forth requirements related to permissible sensor quality levels, failure rates, and overall functional safety.

Operation of sensors can be affected by temperature variations. For example, a sensor installed in an automobile may operate differently when the automobile is first started on a cold day than when the automobile has been running long enough for the electronics to be heated.

Many sensors incorporate temperature sensing elements that can measure temperature. The temperature measurement can be used to compensate or trim operation of the sensor. Incorporating temperature measurement elements, circuitry and compensation circuitry can be costly in terms of additional electronics and die space required.

SUMMARY

The present disclosure provides a sensor interface with processing circuitry for temperature signals as may include one or both of a signal from an NTC element or a signal from a diode. With this arrangement, the sensor interface can accommodate sensing (e.g., pressure sensing) with temperature compensation tailored to customer and application requirements and optionally from redundant temperature sensing elements. The sensor interface incorporates signal conditioning circuitry tailored to the different types of temperature sensors in order to permit accurate compensation for temperature variations to be made accordingly. The described NTC element signal processing results in relatively low current consumption as is particularly advantageous at high temperatures when the NTC resistance is at its lowest. Furthermore, the described NTC element signal processing to generate a signal referenced to the same supply voltage as the ADC used to convert the signal to the digital domain advantageously relaxes requirements on the ADC by canceling dependency on the supply voltage. The described diode signal processing provides accurate absolute temperature sensing by maintaining the ratio of current densities constant over temperature.

According to the disclosure, a circuit configured to be coupled to an NTC element having a non-linear resistance over temperature includes a variable resistor configured to be coupled in series with the NTC element, an operational amplifier having a non-inverting input to which an input voltage is applied, an inverting input coupled to the variable resistor, and an output at which an amplifier output signal indicative of a temperature sensed by the NTC element is generated, and a feedback resistor coupled between the output and the inverting input of the operational amplifier, wherein the amplifier output signal is a linearized version of the non-linear resistance of the NTC element.

The circuit configured to be coupled to an NTC element can include one or more of the following features alone or in combination. The input voltage can be a fraction of a supply voltage of the operational amplifier, for example, one-quarter of the supply voltage. The NTC element has a predetermined resistance range over a predetermined temperature range and the amplifier output signal can have a voltage range between one-quarter of the supply voltage to three-quarters of the supply voltage over the predetermined resistance range of the NTC element. The circuit can include an analog-to-digital converter (ADC) configured to convert the amplifier output signal into a digital signal, wherein the ADC is referenced to the supply voltage of the operational amplifier. The circuit can further include a processor coupled to receive the digital signal and generate an output signal indicative of temperature based on computation of the Steinhart-Hart equation. The variable resistor and the feedback resistor can be a resistor network including a plurality of resistive elements coupled in series, with a first plurality of adjacent pairs interconnected at switch junctions and a second plurality of adjacent pairs interconnected at transmission gate junctions, a plurality of switches, each having a first terminal coupled to a switch junction, a second terminal coupled to the inverting input of the operational amplifier, and a control terminal, and a plurality of transmission gates, each coupled between the output of the operational amplifier and a transmission gate junction.

According to a further aspect of the disclosure, a circuit configured to be coupled to a diode includes a first current path configured to be coupled in series with the diode during a first time interval to draw a first current through the diode and generate a first signal indicative of a voltage drop across the diode, a second current path configured to be coupled in series with the diode during a second time interval to draw a second current through the diode and generate a second signal indicative of a voltage drop across the diode, and an amplifier coupled to the first current path and the second current path and configured to amplify the first signal during the first time interval, amplify the second signal during the second time interval, and generate an amplified signal. An analog-to-digital converter (ADC) is configured to convert the amplified signal into a digital signal and a processor is coupled to receive the digital signal and compute a difference between the first signal and the second signal to generate a diode signal that is proportional to absolute temperature.

The circuit configured to be coupled to a diode can include one or more of the following features alone or in combination. The circuit can be implemented as an integrated circuit (IC) and the diode can be coupled between a supply voltage of the IC and an input pin of the IC that is coupled to the first and second current paths. The circuit can further include a buffer coupled between the input pin of the IC and the first and second current paths. The first current path can include a first resistor in series with a first current sink and the second current path can include a second resistor in series with a second current sink. The first and second resistors can have a substantially fixed ratio of resistances. The first current sink can include a first NMOS FET having a first terminal coupled to the first resistor, a second terminal coupled to ground, and a third, control terminal configured to receive a control signal to establish the first time interval and the second current sink can include a second NMOS FET having a first terminal coupled to the second resistor, a second terminal coupled to ground, and a third, control terminal configured to receive a control signal to establish the second time interval. The amplifier can be further configured to invert the first signal during the first time interval and invert the second signal during the second time interval to generate the amplified signal.

Also described is a sensor interface including a signal path configured to receive a sensing element output signal from a sensing element and to generate an interface output signal indicative of a parameter sensed by the sensing element, an NTC interface configured to be coupled to an NTC element having a non-linear resistance over temperature and to generate an NTC signal indicative of a linearized version of the non-linear resistance of the NTC element, and a diode interface configured to be coupled to a diode and to generate a diode signal indicative of an absolute temperature.

The sensor interface can include one or more of the following features alone or in combination. The NTC interface can include a variable resistor configured to be coupled in series with the NTC element, an operational amplifier having a non-inverting input to which an input voltage is applied, an inverting input coupled to the variable resistor, and an output at which the amplifier output signal is generated, and a feedback resistor coupled between the output and the inverting input of the operational amplifier, wherein the amplifier output signal is a linearized version of the non-linear resistance of the NTC element. The diode interface can include a first current path configured to be coupled in series with the diode during a first time interval to draw a first current through the diode and generate a first signal indicative of a voltage drop across the diode, a second current path configured to be coupled in series with the diode during a second time interval to draw a second current through the diode and generate a second signal indicative of a voltage drop across the diode, an amplifier coupled to the first current path and the second current path and configured to amplify the first signal during the first time interval, amplify the second signal during the second time interval, and generate an amplified signal, an analog-to-digital converter (ADC) configured to convert the amplified signal into a digital signal, and a processor coupled to receive the digital signal and compute a difference between the first signal and the second signal to generate a diode signal that is proportional to absolute temperature. The sensing element can be a strain gauge and the sensed parameter can be pressure. The signal path can include an amplifier configured to amplify the sensing element output signal, an ADC to convert the amplified sensing element output signal into a digital amplified sensing element output signal, and a digital signal processor responsive to the digital amplified sensing element output signal and configured to apply polynomial compensation to linearize the digital amplified sensing element output signal. The digital signal processor can be further responsive to one or both of the NTC signal and the diode signal to linearize the digital amplified sensing element output signal over temperature.

DESCRIPTION OF THE DRAWINGS

The foregoing features of the disclosure, as well as the disclosure itself may be more fully understood from the following detailed description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the disclosure. Like numbers in the figures denote like elements.

DETAILED DESCRIPTION

Figure 1:
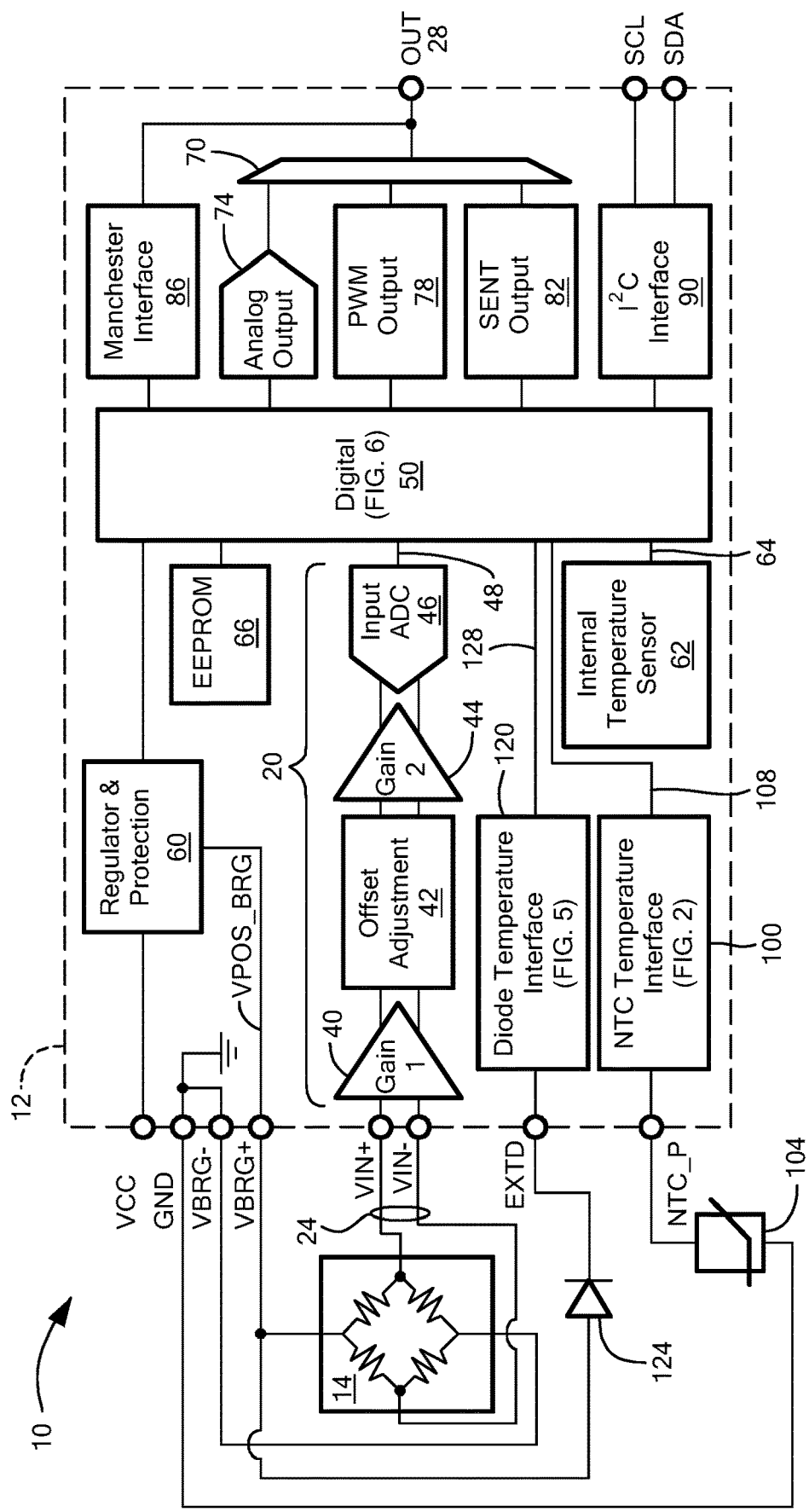
FIG. 1 is a block diagram of a sensor including a sensor interface according to the disclosure.

Referring to FIG. 1, a sensor 10 includes a sensor interface 12 having a main signal path 20 configured to receive a sensing element output signal 24 from a sensing element 14 and to generate an interface output signal 28 indicative of a parameter sensed by the sensing element. Interface 12 further includes an NTC temperature interface 100 configured to be coupled to a Negative Temperature Coefficient (NTC) element 104 having a non-linear resistance over temperature and to generate an NTC signal 108 indicative of a linearized version of the non-linear resistance of the NTC element and a diode temperature interface 120 configured to be coupled to a diode 124 and to generate a diode signal 128 indicative of an absolute temperature.

With this arrangement, sensor interface 12 is provided with improved accuracy by permitting more than one type of temperature sensor to be used and/or a selected one of a plurality of temperature sensor types to be used to suit particular application requirements. Further, sensor interface 12 accommodates signal conditioning tailored to the different types of temperature sensors in order to permit accurate compensation for temperature variations to be made accordingly.

Sensor interface 12 can be used with various types of sensors and can be coupled to various types of sensing elements with which a parameter is measured. Interface 12 conditions sensing element output signals and provides one or more output signals in a format tailored to the particular application. For example, sensor interface 12 can be a pressure sensor interface configured to receive sensing element output signal 24 from a sensing element 14, as may take the form of a strain gauge including one or more variable resistance elements electrically coupled in a Wheatstone bridge configuration. Example strain gauge elements can include piezoresistors that experience a change in resistance when subjected to pressure or mechanical stress. The variable resistance element(s) can be positioned proximate to a membrane or diaphragm that is deformable in response to a pressure difference on opposite sides of the membrane.

Other types of possible sensor interfaces 12 include but are not limited to a magnetic field sensor interface in which the sensing element includes one or more magnetic field transducers to sense a parameter associated with a magnetic field or an optical sensor interface in which the sensing element includes one or more photodetectors to sense light or a number of photons incident on a surface. In the case of a magnetic field sensor, in which the transducer can include one or more Hall effect elements or magnetoresistance elements for example, the sensed parameter can include, but is not limited to a speed of motion of a target, a direction of motion of a target, a target position (e.g., angle or proximity), or a current through a target. In general, sensor interface 12 can be any sensor interface that generates one or more output signals indicative of a sensed parameter based on an input signal from one or more sensing elements and that implements compensation based on temperature.

Sensor interface 12 can be implemented in the form of an Integrated Circuit (IC) having a plurality of terminals, or pins for coupling to external components, circuits, and systems. The interface 12 can be configured to receive differential sensing element output signal 24 at terminals VIN+, VIN− and provide the interface output signal 28 at terminal OUT. The interface IC 12 can be coupled to the NTC element 104 through an NTC_P terminal and can be coupled to the diode 124 through an EXTD terminal, as shown. Additional interface IC terminals include VCC and GND terminals configured for coupling to an external power source (not shown) in order to power the interface IC and VBRG+, VBRG− terminals configured for coupling to the external sensing element 14, as shown.

Main signal path 20 can include elements designed to condition the sensing element output signal 24 for subsequent processing. To this end, signal path 20 can include an amplifier 40 configured to amplify the sensing element output signal 24, an offset adjustment unit 42, a further amplifier 44 to generate an amplified and offset-adjusted version of sensing element output signal, and an analog-to-digital converter (ADC) 46 to convert the amplified sensing element output signal into a digital amplified sensing element output signal 48. The gain and/or offset adjustments can be user programmable. It will be appreciated that in some embodiments, a single gain stage (e.g., amplifier 44) rather than two stages can be used.

A digital signal processor 50 is responsive to the digital amplified sensing element output signal 48 and can be configured to apply polynomial compensation to linearize the digital amplified sensing element output signal 48. As will be explained further in connection with FIG. 6, digital signal processor 50 can implement polynomial compensation over pressure in order to linearize the pressure signal 24 to compensate for non-linearities attributable to the sensing element 14.

Digital signal processor 50 can be further responsive to one or both of the NTC signal 108 and the diode signal 128 in order to linearize the digital amplified sensing element output signal 48 over temperature. Suffice it to say here that which of the NTC signal 108 and/or the diode signal 128 can be a user programmable option. Details of an example digital signal processor 50 are shown and described below in connection with FIG. 6.

Interface output signal 28 can provide an indication of the sensed parameter (e.g., pressure) in various formats. For example, signal 28 can be provided in formats including, but not limited to PWM format, Single Edge Nibble Transmission (SENT) format, Serial Peripheral Interface (SPI) format, Local Interconnect Network (LIN) format, or CAN (Controller Area Network) format. To this end, sensor interface 12 can include a multiplexer 70 coupled to receive signals from a digital-to-analog converter (DAC) 74, from a PWM output circuit 78, and from a SENT output circuit 82. With multiplexer 70, a user can select the format for output signal 28. For example, sensed pressure can be communicated as an analog signal generated by DAC 74, as a PWM signal generated by PWM output circuit 78, and/or as a SENT signal generated by SENT output circuit 82. A Manchester programming interface 86 can be coupled to the output terminal OUT to permit user programming of interface parameters. Interface 12 can also permit the sensed parameter to be communicated in a bidirectional fashion according to the I²C protocol through SCL and SDA terminals, as shown.

NTC element 104 is a device that provides a signal that varies inversely with respect to temperature with a high accuracy, such as on the order of within +/−2° C. NTC element 104 can be positioned in close proximity to the pressure sensing element 14 and coupled to the NTC_P terminal of the interface 12 so as to provide an accurate indication of the temperature of the sensing element 14. NTC element 104 has a non-linear resistance over temperature and NTC temperature interface 100 processes the NTC voltage to generate signal 108 that is a linearized version of the non-linear resistance of the NTC element. Details of an example NTC temperature interface 100 are shown and described below in connection with FIGS. 2 and 4.

Diode 124 has a PN junction that can be operated at different current densities in order to generate diode signal that can be digitally processed to provide a signal 128 that is proportional to absolute temperature (PTAT). Diode temperature interface 120 contains current paths that are selectively enabled and disabled to cause the diode 124 to operate at different current densities and is configured to tightly control the current densities to maintain a fixed ratio over temperature. Details of an example diode temperature interface 120 are shown and described below in connection with FIG. 5.

Additional elements of sensor interface 12 can include an on-chip regulator and protection circuit 60 coupled to receive the supply voltage VCC and generate one or more regulated voltages for powering on-chip and off-chip components. For example, regulator and protection circuit 60 can generate a sensing element supply voltage VPOS_BRG for coupling to the sensing element 14 through the VBRG+ and GND, or VBRG− terminals of the IC 12. Other regulated voltages can be generated to supply other interface circuitry, such as the digital signal processor 50.

An internal temperature sensor 62 can provide an internal temperature signal 64 to the digital signal processor 50. In an example embodiment, internal temperature sensor 62 can take the form of a diode-based thermometer supported by the same semiconductor substrate, or die that supports other elements of the interface 12. In this way, accurate sensing of the interface temperature can be achieved and compensated for by the digital signal processor 50.

In some embodiments, a user can select which one or more of the three temperature signals (i.e., the internal temperature signal 64, the NTC signal 108 and/or the diode signal 128) is used by the digital signal processor 50 to compensate for the sensing element output signal 24 over temperature based on which temperature sensing device(s) is/are considered to be most accurate in the particular application.

Interface output signal 28 can include information in addition to the sensed parameter (e.g., pressure). In particular, interface output signal 28 can include temperature information for use by external circuits and systems. Such temperature information can be provided by internal temperature sensor 62, NTC element 104, and/or by diode 124. Further, sensor interface 12 can include fault circuitry and the output signal 28 can include diagnostic information to identify fault conditions, such as undervoltage, overvoltage, overtemperature, overpressure, and underpressure conditions.

A memory device 66, as may take the form of an Electrically Erasable Programmable Read Only Memory (EEPROM) or other suitable memory type, can be coupled to the digital processor 50 to store data and to permit user programmable data to be entered. For example, a customer can program which of the temperature sensing devices (i.e., internal temperature sensor 62, NTC 104, and/or diode 124) will be used to compensate the sensing element output signal 24 over temperature variations. It will be appreciated that various other trimming and configuration settings can be stored in EEPROM 66.

While the sensor interface 12 may be provided in the illustrated form of an IC with analog front-end circuitry and a digital signal processor or system 50, it will be appreciated that the particular delineation of which circuit functions are implemented in an analog fashion or with digital circuitry and signals can be varied. Further, some of the illustrated circuit functions can be implemented on sensor interface IC 12 and other circuitry and functionality can be implemented on separate circuits (e.g., additional substrates within the same integrated circuit package, additional integrated circuit packages, and/or on circuit boards).

Figure 2:
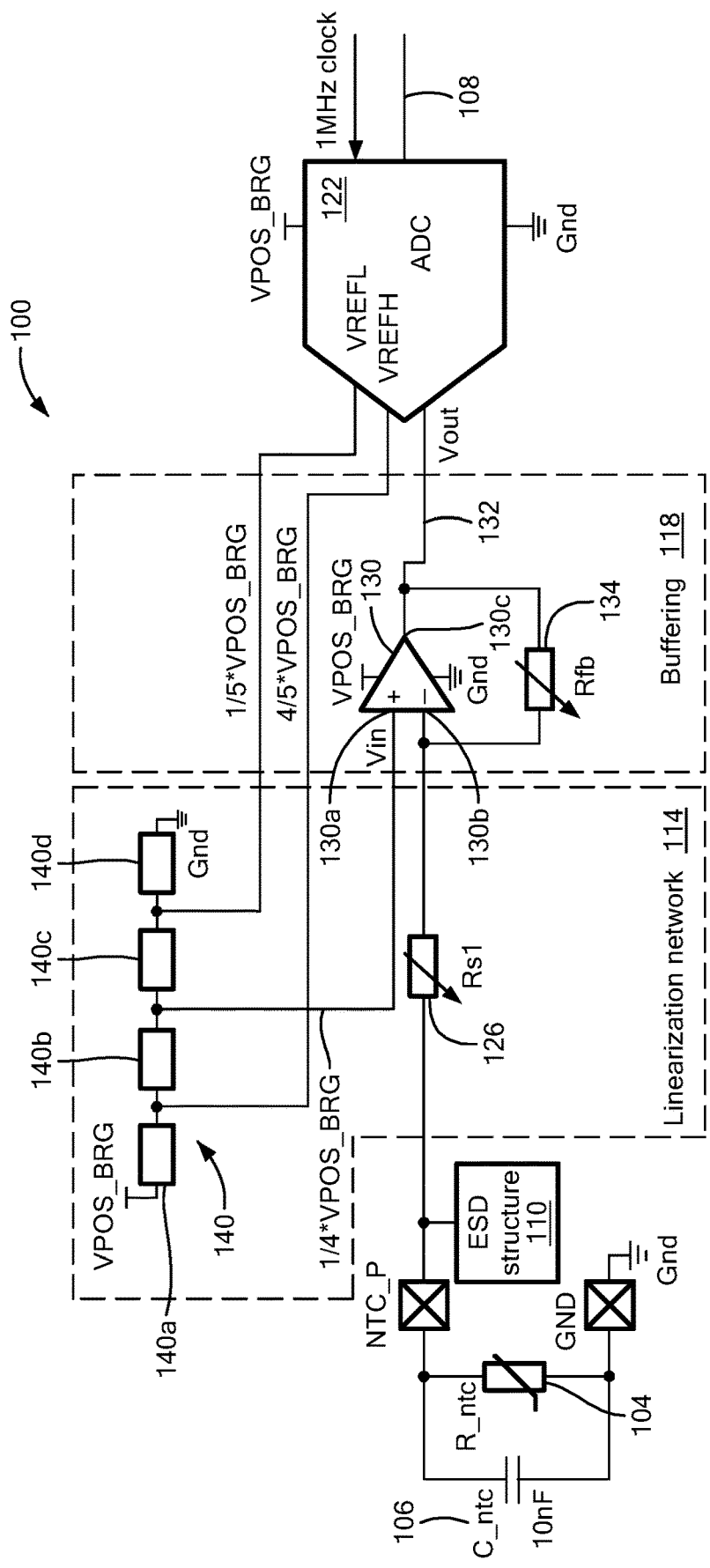
FIG. 2 is a block diagram of an NTC temperature interface according to the disclosure.

Referring to FIG. 2, NTC temperature interface 100 is coupled to NTC element 104 through IC terminals NTC_P and GND. A bypass capacitor 106 can be coupled in parallel with NTC 104 to decouple AC signals or voltage spikes from the NTC element. Also coupled to the NTC_P terminal can be an ESD structure 110 as shown. ESD structure 110 can be any suitable structure for protecting the NTC temperature interface 100 from electrical overstress conditions, such as a Zener diode or other diode clamp element or circuit.

NTC temperature interface 100 includes a linearization network 114 and a buffering stage 118 coupled in series and further coupled to an ADC 122 that generates the NTC signal 108 (FIG. 1). The linearization network 114 can include a variable resistor 126 coupled in series with the NTC element 104 and further coupled to an inverting input 130b of a buffering, non-inverting amplifier 130. Amplifier 130 has a non-inverting input 130a coupled to receive an input voltage Vin and an output 130c at which an amplifier output signal Vout 132 is provided. A feedback resistor 134 is coupled between the output 130c and the inverting input 130b of the amplifier 130 and the amplifier output 130c is coupled to an input of the ADC 122, as shown.

A resistor divider network 140 coupled between the VPOS_BRG voltage and ground includes a plurality of series-coupled resistors 140a-140d to generate an input voltage Vin for coupling to the non-inverting input 130a of the amplifier 130. In the example embodiment, the amplifier input voltage Vin can be ¼*VPOS_BRG. Resistor divider 140 further generates intermediate reference voltages for the ADC 122. For example, a first, high ADC reference voltage VREFH provided between series resistors 140a, 140b can be ⅘*VPOS_BRG and a second, low ADC reference voltage VREFL provided between series resistors 140c, 140d can be ⅕*VPOS_BRG, as shown.

In operation, the amplifier input voltage Vin, here ¼*VPOS_BRG, also appears at the inverting input and the amplifier output voltage Vout is given by:

$$Vout = Vin(1 + Rfb/(Rsl + R\_ntc)) \quad (1)$$

where Vin is ¼*VPOS_BRG in the example embodiment, Rfb is the resistance of feedback resistor 134, Rs is the resistance of series resistor 126, and R_ntc is the resistance of NTC element 104.

With the configuration of NTC temperature interface 100, the amplifier output signal 132 is indicative of a temperature sensed by the NTC element 104 and, in particular, is a linearized version of the non-linear resistance of the NTC element. Furthermore, with this configuration, a lower current is required than would be required using other configurations (e.g., such as by processing a voltage developed across a voltage divider including the NTC and supplied directly from VPOS_BRG). More particularly, by operation of operational amplifier 130, the voltage at the two amplifier inputs 130a, 130b is held to the same value (i.e., in the example embodiment, is held to ¼*VPOS_BRG). The current flow from the amplifier output 130c through feedback resistor 134, series resistor 126, and NTC element 104 is determined by this amplifier input voltage level and, because of the use of a relatively low input voltage, this current is relatively low. Thus, the design of NTC temperature interface 100 and the use of relatively low amplifier input voltage Vin=¼*VPOS_BRG result in relatively low current consumption, as is particularly advantageous for high temperatures, when the NTC element resistance R_ntc can be on the order of tens of Ohms.

As will be explained further in connection with FIG. 4, variable series resistor 126 and variable feedback resistor 134 can be implemented with a network with which a user is able to program these resistor values based on the specifications of the NTC element 104. Thus, the NTC temperature interface 100 can accommodate different NTC elements having a range of specifications.

Figure 3:
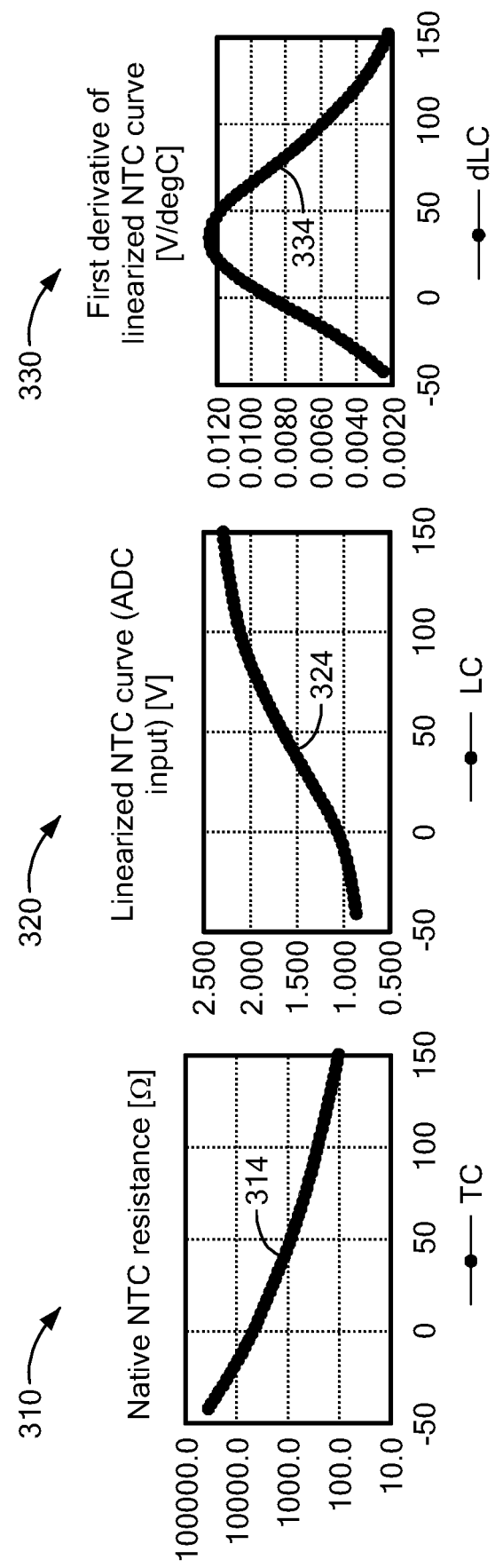
FIG. 3 includes plots illustrating NTC temperature signal processing.

Referring also to FIG. 3, a plot 310 illustrates the resistance (labeled 314) of an example NTC element 104 over temperature with the vertical axis showing resistance in units of Ohms and the horizontal axis showing temperature in units of degrees Celsius. As is apparent, the NTC resistance 314 varies exponentially and significantly over temperature. For example, within the illustrated temperature range of −40° C. to +150° C., the NTC resistance 314 can vary by three to four orders of magnitude.

Also shown in FIG. 3 is a plot 320 illustrating the output signal Vout (labeled 324) of the operational amplifier 130 with the vertical axis showing the output signal Vout 324 in units of volts and the horizontal axis showing temperature in units of degrees Celsius. As is apparent, the effect of processing the signal from the NTC element 104 with the linearization network 114 and non-inverting amplifier stage 118 is to linearize the non-linear NTC resistance and to convert the entire exponential range of NTC element resistance R_ntc to a voltage range from to ¼*VPOS_BRG to ¾*VPOS_BRG. Thus, the amplifier output signal 132 varies much less than the NTC resistance over temperature, for example by approximately one order of magnitude.

Processing the signal from the NTC element 104 in the described manner to generate the amplifier output signal 132 that is referenced to VPOS_BRG and generating reference voltages for the ADC 122 from VPOS_BRG (i.e., with resistor divider 140) relaxes the requirements on the ADC 122 by canceling dependency on VPOS_BRG. A further plot 330 in FIG. 3 illustrates the first derivative (labelled 334) of the operational amplifier output signal 132, with the vertical axis representing the derivative of the voltage in units of Volts/degree Celsius and the horizontal axis representing temperature in degrees Celsius. As is apparent by consideration of curve 334, the sensitivity is the same for low temperatures (e.g., −40° C.) as it is for high temperatures (+150° C.). The ADC 122 is designed to have a resolution, or least significant bit, selected to cover this lowest sensitivity (e.g., 0.0020 V/deg C.) in order to achieve satisfactory digital conversion accuracy over the temperature range of interest.

Figure 4:
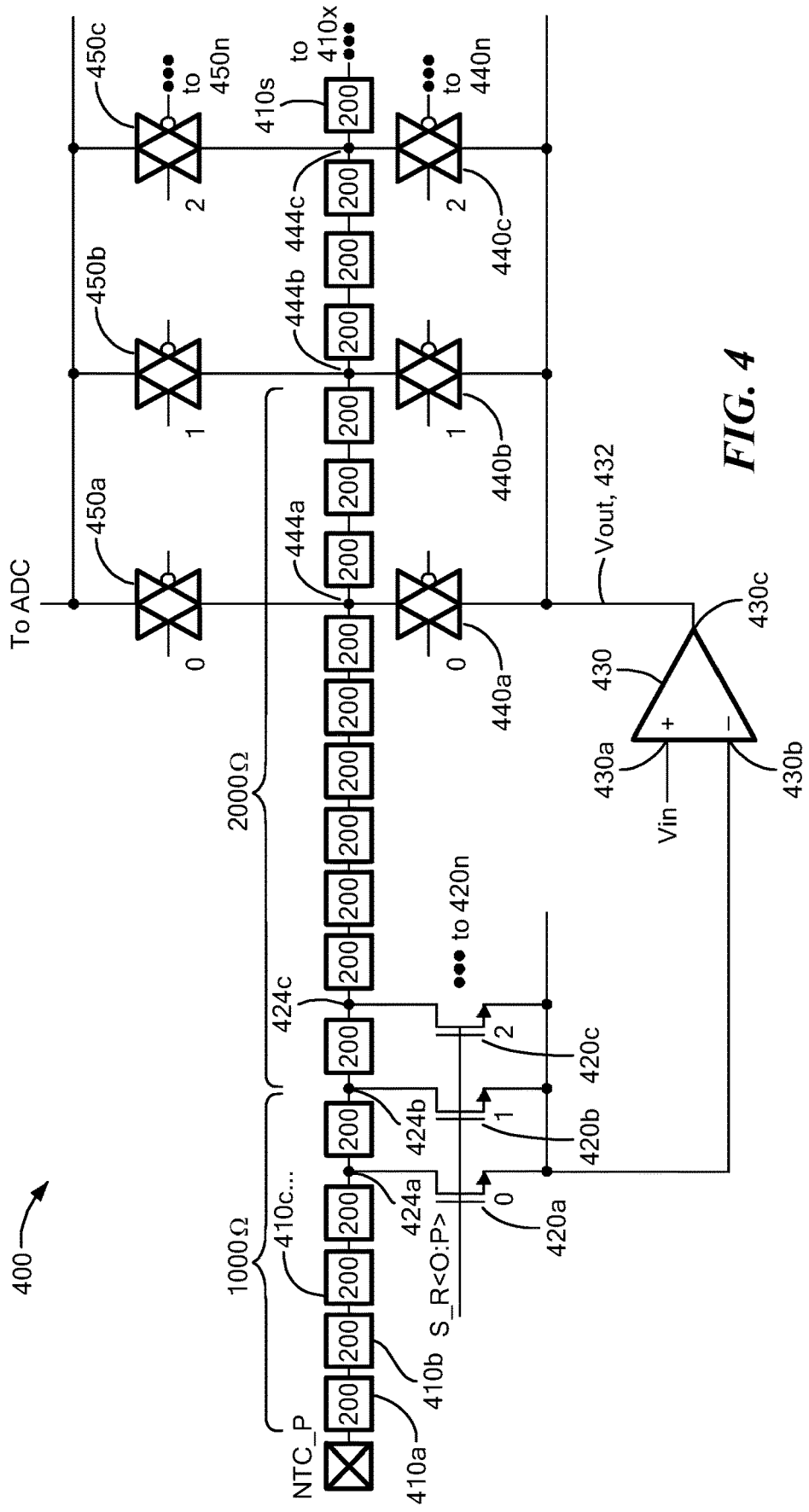
FIG. 4 is a block diagram of an example variable resistor network for use in the NTC temperature interface of FIG. 2.

Referring also to FIG. 4, an example network 400 for implementing variable series resistor Rsl 126 (FIG. 2) and variable feedback resistor Rfb 134 (FIG. 2) is shown. Also shown in FIG. 4 is an amplifier 430 that can be the same as or similar to amplifier 130 of FIG. 2. Amplifier 430 has a non-inverting input 430a coupled to receive an input voltage Vin, an inverting input 430b coupled to receive a signal from an NTC element, and an output 430c at which an amplifier output signal Vout 432 is provided. The input voltage Vin coupled to amplifier input 430a can be the same as or similar to the input voltage of ¼*VPOS_BRG of FIG. 2.

Network 400 includes a plurality of resistor segments 410a-410x coupled in series, a plurality of switches 420a-420n, a first plurality of transmission gates 440a-440n coupled between the amplifier output 430c and a junction between adjacent resistor segments, and a second plurality of transmission gates 450a-450n coupled between a junction between adjacent resistor segments and the input to the ADC (e.g., ADC 122 of FIG. 2). Switches 420a-420n are coupled between adjacent resistor segments and inverting input 430b of amplifier 430. In the example embodiment, each of the resistor segments 410a-410x has a value of 200 Ohms; however, it will be appreciated that other values are possible.

In operation, switches 420a-420n and transmission gates 440a-440n, 450a-450n are controlled to configure the network 400 so as to provide a desired value of series resistance (i.e., resistance in series between the NTC_P terminal and the inverting input 430b of operational amplifier 430) and a desired value of feedback resistance (i.e., resistance coupled between the amplifier output 430c and the amplifier inverting input 430b).

In an example embodiment, the feedback resistance Rfb is two times the series resistance Rsl. This relationship of series resistance and feedback resistance was selected in order to achieve a desired range for the amplifier output voltage based on equation (1) above and facilitate implementation of the variable resistor network 400. It will be appreciated by those of ordinary skill in the art that network 400 can be designed to accommodate other relationships between feedback resistance Rfb and series resistance Rsl.

Control of switches 420a-420n and transmission gates 440a-440n, 450a-450n can be user programmable. Based on the choice of NTC element 104, a user can program the interface accordingly. For example, a user can input a three-bit code with which eight choices of series resistance and corresponding feedback resistance can be selected. In this way, a range of nominal NTC resistance values are supported, for example nominal NTC resistance values of between 1.5K Ohms to 4.0K Ohms.

In some embodiments, it can be desirable to set the value of series resistance to be approximately equal to one-half of the nominal resistance of the NTC element 104 at room temperature as this relationship can achieve approximately the same sensitivity at low and high temperatures (as illustrated by plot 330 in FIG. 3) with the inflection point of the amplifier output signal Vout 432 approximately centered within the specified temperature range as is desirable. It will be appreciated by those of ordinary skill in the art that other relationships between the series resistance and NTC element specifications are possible. In general, network 400 can be designed to accommodate various ranges and resolutions of feedback and series resistance values to suit particular application requirements.

Each of the switches 420a-420n has a first terminal coupled to a respective junction between adjacent resistive elements (referred to herein as switch junctions, with three such junctions labeled 424a-424c), a second terminal coupled to the inverting input 430b of the operational amplifier 430, and a control terminal configured to receive a control signal. In the example embodiment, each of switches 420a-420n is a NMOS transistor, with a drain terminal coupled to a switch junction, a source terminal coupled to the inverting input 430b of the amplifier 430, and a gate terminal to which a control signal is coupled.

Each of the first plurality of transmission gates 440a-440n is coupled between the amplifier output 430c and a respective junction between adjacent resistive elements (referred to herein as transmission gate junctions, with three such junctions labeled 444a-444c) and each of the second plurality of transmission gates 450a-450n is coupled between a transmission gate junction and an input to the ADC (e.g., ADC 122 of FIG. 2), as shown.

In order to select a particular value for the series resistance and feedback resistance, at any given time, one of the switches 420a-420n is on (i.e., closed) and one vertical path of transmission gates (e.g., gates 440a and 450a, or gates 440b and 450b, or gates 440c and 450c) is on (i.e., closed). With the switches and transmission gates thus controlled, a first subset of resistor segments 410a-410x will be coupled between the NTC_P terminal and the amplifier inverting input 430b to provide the series resistance (i.e., Rsl 126 of FIG. 2) and a second subset of resistor segments 410a-410x will be coupled between the amplifier output 430c and inverting input 430b to provide the feedback resistance (i.e., Rfb 134 of FIG. 2).

For example, the user can input a programming code value of "0" that causes switch 420a and transmission gates 440a and 450a to be closed and the remaining switches 420b-420n and transmission gates 440b-440n and 450b-450n to be open. With the network 400 configured in this manner, four resistor segments 410a-410d are coupled in series between the NTC_P terminal and the inverting amplifier input 430b yielding a series resistance of 800 Ohms (in the example embodiment in which each resistor segment has a value of 200 Ohms) and eight resistor segments 410e-410l are coupled between the amplifier output 430c and the inverting amplifier input 430b yielding a feedback resistance of 1600 Ohms. In a similar fashion, a user programmed code value of "1" can cause switch 420b and transmission gates 440b and 450b to be closed and the remaining switches 420a and 420c-420n and transmission gates 440a, 450a, 440c-440n and 450c-450n to be open. With the network 400 configured in this manner, five resistor segments 410a-410e are coupled in series between the NTC_P terminal and the inverting amplifier input 430b yielding a series resistance of 1000 Ohms (in the example embodiment in which each resistor segment has a value of 200 Ohms) and ten resistor segments 410f-410o are coupled between the amplifier output 430c and the inverting amplifier input 430b yielding a feedback resistance of 2000 Ohms. In an example embodiment, additional programming codes can result in further network configurations whereby the user can choose from eight possible options of series resistance and feedback resistance with the series resistance ranging between 800 Ohms and 2200 Ohms (in 200 Ohm increments) and the feedback resistance ranging between 1600 Ohms and 4400 Ohms (in 400 Ohm increments).

Advantageously, network 400 permits accurate fine tuning of the linearization of the amplifier output signal 432 tailored to the particular NTC element 104. Furthermore, higher order temperature dependent parasitic resistance within the variable resistor network 400 is eliminated by the illustrated design in which there are no switches or transmission gates in the sensitive part of the high current path. In other words, ideally the series resistance and feedback resistance provided by the network 400 should be constant over temperature so that the current through the network corresponds to the measured temperature. With network 400, no voltage drop across switches 420a-420n possibly impacting precision of equation (1) above occurs, since inverting input 430b is high-impedance and no current thus flows through switches 420a-420n. Furthermore, there is no current flow through transmission gates 450a-450n due to the high impedance input of the ADC. And even though current will flow through the transmission gates 440a-440n, the amplifier feedback loop is closed around the transmission gates 440a-440n and the operational amplifier 430 regulates the voltage at its input, thereby preventing any parasitic resistance of these transmission gates from affecting the linearization. More particularly, operational amplifier 430 has reference voltage Vin at its non-inverting input 430a and sees a voltage drop at its inverting input 430b associated with Rntc+Rsl (based on current flowing through Rfb and Rsl from output 430c) and thus regulates its output voltage 432 in such a way to establish a voltage equilibrium between input terminals 430a and 430b. This process is independent of any voltage drop on transfer gates 440a-440n. In other words, even though there will be a drop on transfer gates 440a-440n, since the output to the ADC is accomplished via transfer gates 450a-450n, the ADC does not see this drop; but rather only sees the drop on Rfb. As a result, calibration by the digital signal processor 50 (FIGS. 1 and 6) does not require high order terms and calibration can be achieved over only two die temperatures. It will be appreciated that NMOS switches 420a-420n can alternatively be implemented as transfer gates or PMOS switches. Furthermore, transfer gates 430a-430n and/or 440a-440n can alternatively be implemented as simple NMOS or PMOS switches.

Figure 5:
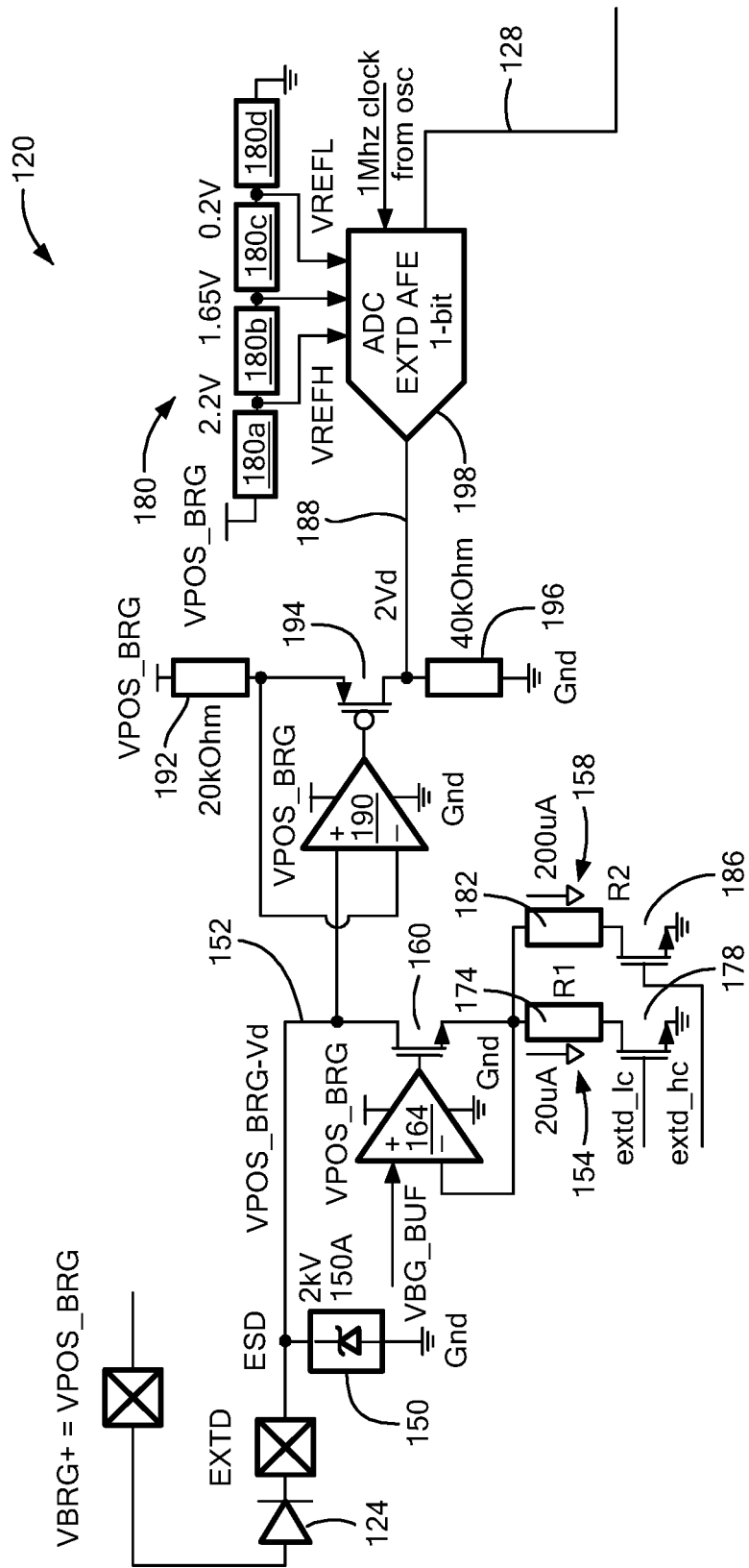
FIG. 5 is a block diagram of a diode temperature interface according to the disclosure.

Referring to FIG. 5, diode temperature interface 120 includes circuitry for processing a signal from external diode 124 coupled between the VPOS_BRG terminal and the EXTD terminal to generate the diode signal 128 that is proportional to absolute temperature. Also coupled to the EXTD terminal can be an ESD structure 150 as shown. ESD structure 150 can be any suitable structure for protecting the diode temperature interface 120 from electrical overstress conditions, such as a Zener diode or other diode clamp element or circuit.

As noted above, diode temperature interface 120 contains current paths that cause the external diode 124 to operate at different current densities, here a first current path 154 and a second current path 158. A FET 160 can be coupled in series with both the first and second current paths 154, 158 and can be controlled by the output of a voltage follower buffer amplifier 164, as shown. Amplifier 164 has a non-inverting input coupled to receive a reference voltage, such as a 1.2 volt buffered bandgap reference voltage.

First current path 154 can include FET 160, a resistor 174, and a transistor 178 that is controlled by an extd_lc signal. Second current path 158 can include FET 160, a resistor 182, and a transistor 186 that is controlled by an extd_hc signal.

The diode 124 is operated at different current densities at different times. In particular, during a first time interval, diode 124 is operated at a first current density J1 established by the first current path 154 and during a second time interval, diode 124 is operated at a second current density J2 established by a combination of the first and second current path 154, 158.

As shown in FIG. 1, diode 124 is coupled between the EXTD terminal and the VBRG+ terminal at which the VPOS_BRG voltage is applied. Thus, the voltage 152 at the EXTD terminal can be given by VPOS_BRG−Vd, where Vd is the voltage drop across the diode 124.

A voltage follower amplifier 190 has a non-inverting input coupled to the EXTD terminal to receive the VPOS_BRG−Vd voltage 152, an inverting input, and an output coupled to a control terminal of a transistor 194. Transistor 194 can be coupled in series with resistors 192, 196, with the inverting input of the amplifier 190 coupled to a junction between transistor 194 and resistor 192, as shown.

Amplifier 190, transistor 194, and resistors 192, 196 function to invert and amplify the input signal 152 and shift its reference voltage from the positive supply voltage VPOS_BRG to ground. Thus, the resulting signal 188 at the drain terminal of transistor 194 that is coupled to an ADC 198 can be given by 2Vd referenced to ground GND. The ratio of resistors 192, 196 establishes the gain (i.e., here multiplication factor of two) and the inversion is accomplished by the voltage follower configuration of operational amplifier 190 and transistor 194. Inverting the diode voltage and level-shifting the signal to be referenced to ground simplifies conversion of the resulting signal 188 by the ADC 198 to the digital domain.

In operation, during a first time interval, the first current path 154 is coupled in series with the diode 124 to draw a first current I1 through the diode and generate a first signal indicative of a first voltage drop across the diode. During a second time interval, both the first current path 154 and the second current path 158 are coupled in series with the diode 124 to draw a second current I2 through the diode and generate a second signal indicative of a second voltage drop across the diode.

The first and second time intervals are established and controlled by signals extd_lc and extd_hc. In an example embodiment, during the first time interval, current path 154 can be enabled (i.e., by turning on transistor 178 to sink current through resistor 174 and transistor 178) and current path 158 can be disabled by turning off transistor 186. During the second time interval, both of current paths 154, 158 can be enabled (i.e., both of transistors 178 and 186 can be on to sink current through resistors 174, 182 and transistors 178, 186). In the example embodiment, transistors 178, 186 are NMOS FETs.

The currents I1, I2 through the diode 124 during the first and second time intervals, respectively, can be given by the following:

$$I1 = VBG\_BUF/R1 = 1.2V/60\ k\Omega = 20\ uA \quad (2)$$

$$I2 = VBG\_BUF/(R1 \| R2) = 1.2V/5.45\ k\Omega = 220\ uA \quad (3)$$

The selection of resistance values for resistors R1 and R2 can be based on various factors including, but not limited to the biasing voltage levels and the desired current ratio. The example resistance values of 60 kΩ and 6 kΩ for resistors 174 and 182, respectively, are illustrative only. It will be appreciated by those of ordinary skill in the art that other resistance values can be used in order to accomplish the desired operation at two different current densities, including the use of the same or different resistance values for resistors 174, 182.

ADC 198 is coupled to receive the signal 188 and reference voltages generated by a resistor divider network 180 including resistors 180a, 180b, 180c, and 180d coupled to receive the VPOS_BRG voltage, as shown. ADC 198 can take various forms, including a sigma delta modulator.

By processing the diode voltage drop signal 188 to determine a difference between the diode voltage drop during the first time interval and the diode drop during the second time interval (i.e., during operation at the first current density J1 and operation at the second current density J2), a signal that is proportional to the actual temperature of the diode (PTAT) can be calculated. Processor 50 (FIG. 1) can be configured to calculate the PTAT signal based on the diode signal 128 as described below in connection with FIG. 6.

In general, the voltage difference ΔVd of the diode 124 PN junction biased at different current densities can be given by:

$$\Delta Vd = (Nc*K*T/q)*\ln(I2/I1) \quad (4)$$

where K is Boltzmann constant, T is external temperature in degrees Kelvin, q is electron charge ($-1.602 \times 10^{-19}$ C), and Nc is the ideality factor, also known as emission coefficient, of used PN junction.

It then follows that in the example embodiment in which the ratio of currents I1 and I2 is constant, the sensitivity of the circuit (or change in diode voltage over time) can be given by:

$$d(\Delta Vd)/dT = (Nc*K/q)*\ln(N) = 220\ \mu V/K \quad (5)$$

where N is the ratio of currents I2/I1. Given that the diode voltage is doubled by the circuit 120 to generate signal 188, the sensitivity becomes 440 μV/K.

The accuracy with which the resulting diode signal 128 indicates absolute temperature is based, in part, on maintaining the ratio of current densities constant over temperature. Maintaining a fixed ratio of current densities is facilitated by tight control resistances of resistors R1 and R2 and also currents I1 and I2 as can be achieved by using well-matched resistors R1 and R2 and a trimmed reference voltage, such as the VBG_BUF voltage derived from a temperature independent bandgap voltage source. With this arrangement, the ratio of the diode biasing currents I2/I1 can be well defined and substantially fixed over temperature.

It will be appreciated that the selection of the ratio of diode biasing currents I2/I1 can be varied. In general, the higher the ratio, the better the achievable sensitivity. However, the higher the high current I2, the greater the power dissipation and the lower the low current I1, the more susceptible the ratio accuracy is to temperature dependent leakages in the signal path (e.g., attributable to the ESD structure 150). In an example embodiment, these factors are optimized by selecting the ratio of diode biasing currents to be 11 (i.e., 220 μA/20 μA).

Figure 6:
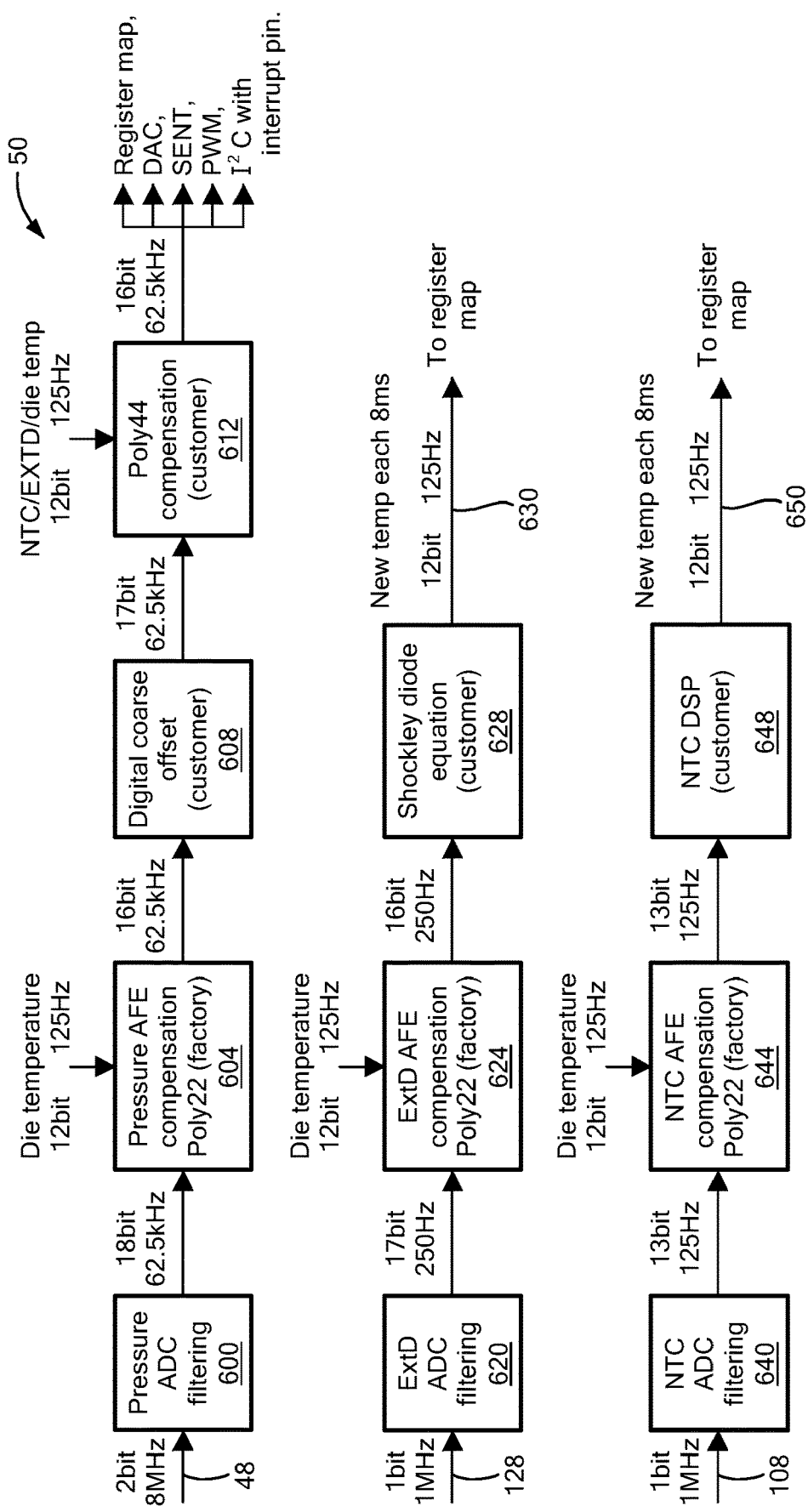
FIG. 6 is a block diagram of a digital portion of the sensor interface of FIG. 1.

Referring also to FIG. 6, digital signal processor 50 is coupled to receive the digital amplified sensing element output signal 48, the diode signal 128, and the NTC signal 108. As noted above, the sensing element output signal 48 is indicative of a sensed parameter, such as pressure in the example embodiment.

Digital processing of the sensing element output signal 48 can include various functions and/or blocks in order to condition the signal, such as by linearizing the signal. Here, such processing can include filtering by a filter block 600, temperature compensation by a Pressure Analog Front End (AFE) compensation Poly22 block 604 that can be responsive to a die temperature signal (e.g., signal 64 of FIG. 1), coarse offset adjustment by block 608, and temperature compensation by a Poly44 compensation block 612 that can be responsive to a selected temperature signal.

Filter 600 can implement low pass filtering, for example with a sigma delta decimation filter, in order to reduce the signal rate and remove out of signal band noise.

Pressure AFE compensation Poly22 block 604 recomputes its input data using a two-dimensional polynomial function (second order over die temperature, second order over input pressure data) into 16-bit word @62.5 kHz. The purpose of block 604 is to factory calibrate imperfections of the pressure analog front end in order to eliminate mismatch and process variation error sources.

Digital coarse offset block 608 can allow for user-programmable shifting and scaling of the input signal into a target range appropriate for subsequent processing.

Poly44 compensation block 612 implements compensation of the sensing element 14 (FIG. 1) as well as other imperfections in order to linearize the non-linear strain gauge sensitivity. The Poly44 compensation block 612 can implement a selectable degree of compensation (e.g., from Poly(1,1) to Poly(4,4) and including intermediate degrees such as Poly(2,4)).

Any of the three thermometer output temperatures (i.e., as indicated by NTC signal 108, diode signal 128, and internal temperature signal 64 of FIG. 1) can be selected for use by the Poly44 compensation block 612 depending on which one or ones is/are considered to follow the strain gauge temperature with minimum error. A 16-bit compensated output pressure signal of block 612 can provide the interface output signal 28 (FIG. 1) via an analog output, a digital output protocol, or through I²C communication.

Digital processing of the diode signal 128 can include various functions and/or blocks in order to generate a signal 630 stored in a register for optional use by the Poly44 compensation block 612 to perform temperature compensation on the pressure signal. Here, such processing can include filtering by a filter block 620, temperature compensation by an ExtD AFE compensation Poly22 block 624, and Shockley diode computation by a block 628.

Filter 620 can implement low pass filtering, for example with a second order cascaded integrator comb (CIC) filter, in order to reduce the signal rate and remove out of signal band noise.

ExtD AFE compensation Poly22 block 624 recomputes its input data using a two-dimensional polynomial function (second order over die temperature, second order over input data) into a 16-bit word at 250 Hz. The purpose of block 624 is to factory calibrate imperfections of the analog front end in order to eliminate mismatch and process variation error sources.

Shockley diode computation block 628 processes the diode voltage samples acquired during the first and second time intervals described above in connection with FIG. 5 in order to generate signal 630 having a value that is proportional to absolute temperature. In an example embodiment, the samples obtained for the two current levels I1, I2 at 4 ms are subtracted from each other in order to obtain a new ΔVd value every 8 ms. Processing at this stage allows customer configuration of ideality factor via EEPROM registers based on the customer chosen diode type.

Digital processing of the NTC signal 108 can include various functions and/or blocks in order to generate a signal 650 stored in a register for optional use by the Poly44 compensation block 612 to perform temperature compensation on the pressure signal. Here, such processing can include filtering by a filter block 640, temperature compensation by an NTC AFE compensation Poly22 block 644, and customer configurable further digital processing by an NTC DSP block 648.

Filter 620 can implement low pass filtering, for example with a sigma delta filter, in order to reduce the signal rate and remove out of signal band noise.

NTC AFE compensation Poly22 block 644 recomputes its input data using a two-dimensional polynomial function (second order over die temperature, second order over input data) into a 13-bit word at 125 Hz. The purpose of block 644 is to factory calibrate imperfections of the analog front end in order to eliminate mismatch and process variation error sources.

NTC DSP block 648 performs an inverse calculation of the Steinhart-Hart equation in order to convert the input conditioned signal into signal 650 that is indicative of temperature in degrees of Celsius. The Steinhart-Hart equation can be represented as follows:

$$1/T = A_1 + B_1 \ln(R_{NTC}/R_{25}) + C_1 \ln^2(R_{NTC}/R_{25}) + D_1 \ln^3(R_{NTC}/R_{25}) \quad (6)$$

where A1, B1, C1, D1 and R25 are NTC element related parameters and $R_{NTC}$ is from the signal 108 (FIG. 1). Processing at this stage allows customer configuration via EEPROM registers based on the chosen NTC element 104.

As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A circuit comprising:
   a variable resistor coupled in series with a selected non-linear temperature coefficient (NTC) element;
   an operational amplifier having a non-inverting input to which an input voltage is applied, an inverting input coupled to the variable resistor, and an output at which an amplifier output signal indicative of a temperature sensed by the NTC element is generated, the amplifier output signal being a linearized version of the non-linear resistance of the NTC element; and
   a feedback resistor coupled between the output of the operational amplifier and the inverting input of the operational amplifier,
   wherein the variable resistor and feedback resistor are formed from a resistor network, the resistor network comprising
   a plurality of resistive elements coupled in series, with a first adjacent pair of the resistive elements interconnected at a switch junction and a second adjacent pair of the resistive elements interconnected at a transmission gate junction;
   a switch having a first terminal coupled to the switch junction, a second terminal coupled to the inverting input of the operational amplifier, and a control terminal that receives a control signal configuring a resistance of the variable resistor; and
   a transmission gate coupled between the output of the operational amplifier and the transmission gate junction, the transmission gate comprising a control terminal that receives a control signal configuring a resistance of the feedback resistor,
   wherein the resistance of the variable resistor and the resistance of the feedback resistor are configured based on a specification of the NTC element.

2. The circuit of claim 1, wherein the input voltage is a fraction of a supply voltage of the operational amplifier.

3. The circuit of claim 2, wherein the input voltage is one-quarter of the supply voltage.

4. The circuit of claim 2, wherein the NTC element has a predetermined resistance range over a predetermined temperature range and wherein the resistance of the variable resistor and the resistance of the feedback resistor produce an amplifier output signal that has a voltage range between one-quarter of the supply voltage to three-quarters of the supply voltage over the predetermined resistance range of the NTC element.

5. The circuit of claim 2, further comprising an analog-to-digital converter (ADC) configured to convert the amplifier output signal into a digital signal, wherein the ADC is referenced to the supply voltage of the operational amplifier.

6. The circuit of claim 5, further comprising a processor coupled to receive the digital signal and generate an output signal indicative of temperature based on computation of the Steinhart-Hart equation.

7. The circuit of claim 6, wherein the digital signal comprises a first signal, and wherein the processor is further configured to receive a second signal from a sensor, and to linearize the second signal from the sensor to compensate for non-linearities due to temperature based on the first signal.

8. The circuit of claim 5, wherein the transmission gate comprises a first transmission gate, and the resistor network further comprises a second transmission gate coupled between the transmission gate junction and an input to the ADC.

9. The circuit of claim 1, wherein resistor network further comprises:
  a first plurality of adjacent pairs of the resistive elements interconnected at switch junctions and a second plurality of adjacent pairs of the resistive elements interconnected at transmission gate junctions;
  a plurality of switches, each having a first terminal coupled to a respective one of the switch junctions, a second terminal coupled to the inverting input of the operational amplifier, and a control terminal; and
  a plurality of transmission gates, each coupled between the output of the operational amplifier and a respective one of the transmission gate junctions.

10. The circuit of claim 9, further comprising a processor configured to:
  receive an input signal from a user indicative of desired resistance values for the variable resistor and the feedback resistor; and
  control the plurality of switches and transmission gates to provide the desired resistance values for the variable resistor and the feedback resistor based on the received input signal.

11. The circuit of claim 9, wherein the plurality of transmission gates comprises a first plurality of transmission gates, and the resistor network further comprises a second plurality of transmission gates, each of which is coupled between a respective transmission gate junction and an input to an analog-to-digital converter (ADC).

12. The circuit of claim 1, wherein when the switch is operated, the variable resistor comprises a first set of the resistive elements coupled between the NTC element and the inverting input of the operational amplifier, and the feedback resistor comprises a second set of the resistive elements coupled in a feedback path between the output of the operational amplifier and the inverting input of the operational amplifier.

13. The circuit of 1, wherein when the switch and transmission gate is operated, the variable resistor comprises a first set of the resistive elements coupled between the NTC element and the inverting input of the operational amplifier, and the feedback resistor comprises a second set of the resistive elements coupled in a feedback path between the output of the operational amplifier and the inverting input of the operational amplifier.

14. The circuit of claim 1, wherein the resistance of the feedback resistor is two times the resistance of the variable resistor.

15. The circuit of claim 1, wherein the resistance of the variable resistor is one half of a nominal resistance of the NTC element.

16. A circuit comprising:
  a variable resistor coupled in series with a non-linear temperature coefficient (NTC) element;
  an operational amplifier having a non-inverting input to which an input voltage is applied, an inverting input coupled to the variable resistor, and an output at which an amplifier output signal indicative of a temperature sensed by the NTC element is generated, the amplifier output signal being a linearized version of the non-linear resistance of the NTC element;
  a feedback resistor coupled between the output of the operational amplifier and the inverting input of the operational amplifier;
  an analog-to-digital converter (ADC) configured to convert the amplifier output signal into a digital signal; and
  a resistor network comprising a plurality of resistive elements coupled in series between a supply voltage of the operational amplifier and a ground reference potential,
  wherein junctions between pairs of the resistive elements are coupled to an input to the ADC to generate intermediate reference voltages for the ADC, and
  wherein a junction between a pair of the resistive elements is coupled to the non-inverting input of the operational amplifier to apply the input voltage to the operational amplifier.

17. The circuit of claim 16, wherein the input voltage is one-quarter of the supply voltage.

18. A circuit comprising:
  a variable resistor coupled in series with a non-linear temperature coefficient (NTC) element;
  an operational amplifier having a non-inverting input to which an input voltage is applied, an inverting input coupled to the variable resistor, and an output at which an amplifier output signal indicative of a temperature sensed by the NTC element is generated, the amplifier output signal being a linearized version of the non-linear resistance of the NTC element;
  a feedback resistor coupled between the output of the operational amplifier and the inverting input of the operational amplifier;
  an analog-to-digital converter (ADC) configured to convert the amplifier output signal into a digital signal; and
  a resistor network comprising
    a plurality of resistive elements coupled in series;
    junctions between pairs of the resistive elements;
    a first plurality of transmission gates, each of which is coupled between a respective one of the junctions and the output of the operational amplifier; and
    a second plurality of transmission gates, each of which is coupled between a respective one of the junctions and an input to the ADC.

* * * * *